(12) United States Patent
Wang et al.

(10) Patent No.: US 12,671,567 B1
(45) Date of Patent: Jun. 30, 2026

(54) TRANCEIVERS, METHOD AND NETWORK DEVICE IMPLEMENTING A PHASE INTERPOLATOR CORE AND LC TANK FOR FREQUENCY-DEPENDENT IMPEDANCE TUNING

(71) Applicant: Marvell Asia Pte Ltd, Singapore (SG)

(72) Inventors: Yuchen Wang, San Jose, CA (US); Jianmin Guo, Fremont, CA (US); Xin Ma, San Jose, CA (US)

(73) Assignee: MARVELL ASIA PTE LTD, Singapore (SG)

( * ) Notice: Subject to any disclaimer, the term of this patent is extended or adjusted under 35 U.S.C. 154(b) by 0 days.

(21) Appl. No.: 18/815,523

(22) Filed: Aug. 26, 2024

Related U.S. Application Data

(60) Provisional application No. 63/536,067, filed on Aug. 31, 2023.

(51) Int. Cl.
*H04L 7/02* (2006.01)
*H03K 5/13* (2014.01)

(52) U.S. Cl.
CPC .... *H04L 7/02* (2013.01); *H03K 5/13* (2013.01)

(58) Field of Classification Search
CPC ..................................... H04L 7/02; H03K 5/13
USPC .......................................................... 375/354
See application file for complete search history.

(56) References Cited

U.S. PATENT DOCUMENTS 9,819,356 B2 * 11/2017 Ponton ................ H04L 27/2331
2011/0298549 A1 * 12/2011 Luong .................... H03K 5/124
331/117 FE

* cited by examiner

*Primary Examiner* — Fitwi Y Hailegiorgis

(57) ABSTRACT

A transceiver for a network device includes clock-data recovery (CDR) circuitry that operates based on an input clock associated with a transmitted signal received by the transceiver. The CDR circuitry includes a phase interpolator (PI) core configured to process a plurality of phases of an the input clock, an inductor-capacitor (LC) tank configured to convert an output current of the PI core to an output voltage based on a frequency-dependent impedance, and control circuitry configured to tune the frequency-dependent impedance based on a frequency of the input clock.

21 Claims, 6 Drawing Sheets

310

Output INTO

Other phase

Bias voltage

Phase selection_0_<5:0>

Input clk P <0>

206

Output INTO

210

302 Bias voltage

304 Phase selection_7:0_<5:0>

303 Input clk P <7:0>

220

230

700

TRANCEIVERS, METHOD AND NETWORK DEVICE IMPLEMENTING A PHASE INTERPOLATOR CORE AND LC TANK FOR FREQUENCY-DEPENDENT IMPEDANCE TUNING

CROSS REFERENCE TO RELATED APPLICATION

This disclosure claims the benefit of commonly-assigned U.S. Provisional Patent Application No. 63/536,067, filed Aug. 31, 2023, which is hereby incorporated by reference herein in its entirety.

FIELD OF USE

This disclosure relates to clock-data recovery (CDR) circuitry (e.g., in a serial interface). More particularly, this disclosure relates to CDR circuitry having a high-speed phase interpolator (PI).

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the subject matter of the present disclosure.

CDR circuitry may be used to sample information from an incoming signal. A PI may be included within CDR circuitry to correct for frequency offsets associated with that sampling. The maximum frequency at which the PI can operate may impose a maximum frequency on the incoming signal.

SUMMARY

In accordance with implementations of the subject matter of this disclosure, a transceiver for a network device includes clock-data recovery (CDR) circuitry that operates based on an input clock associated with a transmitted signal received by the transceiver, the CDR circuitry including a phase interpolator (PI) core configured to process a plurality of phases of an the input clock, an inductor-capacitor (LC) tank configured to convert an output current of the PI core to an output voltage based on a frequency-dependent impedance, and control circuitry configured to tune the frequency-dependent impedance based on a frequency of the input clock.

In a first implementation of such a transceiver, the LC tank includes a first branch and a second branch, each of the first branch and the second branch comprising an inductor and a plurality of capacitors, and a plurality of switches, wherein each respective switch of the plurality of switches is arranged between a respective capacitor of the first branch and a respective capacitor of the second branch.

According to a first aspect of that first implementation of such a transceiver, the control circuitry is configured to tune the frequency-dependent impedance by opening or closing switches of the plurality of switches.

In a first instance of that first aspect, the control circuitry includes peak detector circuitry configured to determine a magnitude of the output voltage.

According to a first alternative of that first instance, the peak detector circuitry includes an operational amplifier configured to charge a capacitor based on the output current and the frequency-dependent impedance, and a register configured to store at least one voltage of the capacitor, wherein determining the magnitude of the output voltage is based on the at least one voltage of the capacitor.

In a first variation of that first alternative, the control circuitry is further configured to implement a plurality of configurations of the plurality of switches, each respective one of the plurality of configurations corresponding to a respective frequency-dependent impedance, and determine a maximum voltage of the capacitor based on inspecting the at least one voltage of the capacitor for each configuration of the plurality of configurations.

According to a first alternate of that first variation, the control circuitry is further configured to implement a particular configuration of the plurality of configurations to cause the LC tank to provide the magnitude of the output voltage as a maximum output voltage.

According to a second aspect of that first implementation of such a transceiver, the PI core is configured to receive a differential input and provide a differential output, and the first branch and the second branch of the LC tank are coupled to respective differential legs of the PI core.

In a second implementation of such a transceiver, the transceiver further includes a cross latch coupled to the LC tank to tune a quality factor of the frequency-dependent impedance.

According to a first aspect of that second implementation of such a transceiver, the cross latch includes a current mirror, and the control circuitry is further configured to tune the quality factor of the frequency-dependent impedance by controlling a current flowing through the current mirror.

In accordance with implementations of the subject matter of this disclosure, a method for operating a transceiver for a network device includes processing, using a phase interpolator (PI) core, a plurality of phases of an input clock, converting, using an inductor-capacitor (LC) tank, an output current of the PI core to an output voltage based on a frequency-dependent impedance, and tuning, using control circuitry, the frequency-dependent impedance based on a frequency of the input clock.

In a first implementation of such a method, the LC tank includes a first branch and a second branch, each of the first branch and the second branch include an inductor and a plurality of capacitors, and the LC tank further includes a plurality of switches, each respective switch of the plurality of switches being arranged between a respective capacitor of the first branch and a respective capacitor of the second branch, and the method further includes tuning, using the control circuitry, the frequency-dependent impedance by opening or closing switches of the plurality of switches.

According to a first aspect of that first implementation, the control circuitry includes peak detector circuitry, and the method further includes determining, using the peak detector circuitry, a magnitude of the output voltage.

In a first instance of that first aspect, the peak detector circuitry includes a register and an operational amplifier configured to charge a capacitor based on the output current and the frequency-dependent impedance, and the method further includes storing, using the register, at least one voltage of the capacitor, and determining the magnitude of the output voltage based on the at least one voltage of the capacitor.

According to a first alternative of that first instance, the method further includes implementing, using the control circuitry, a plurality of configurations of the plurality of switches, each respective one of the plurality of configurations corresponding to a respective frequency-dependent impedance, and determining a maximum voltage of the capacitor based on inspecting, using the control circuitry, the at least one voltage of the capacitor for each configuration of the plurality of configurations.

In a first variation of that first alternative, the method also includes implementing, using the control circuitry, a particular configuration of the plurality of configurations to cause the LC tank to provide the magnitude of the output voltage as a maximum output voltage.

According to a first alternate of that first variation, the first branch and the second branch of the LC tank are coupled to respective differential legs of the PI core, and processing the plurality of phases of the input clock includes receiving differential inputs from the input clock and providing differential outputs to the first branch and the second branch of the LC tank, respectively.

A second aspect of that first implementation of such a method also includes tuning, using a cross latch coupled to the LC tank, a quality factor of the frequency-dependent impedance.

In a second implementation of such a method, the cross latch includes a current mirror, and tuning, using the control circuitry, the frequency-dependent impedance includes controlling a current flowing through the current mirror.

In accordance with implementations of the subject matter of this disclosure, a network device includes a transceiver and a host, the transceiver including a phase interpolator (PI) core configured to process a plurality of phases of an input clock, an inductor-capacitor (LC) tank configured to convert an output current of the PI core to an output voltage based on a frequency-dependent impedance, control circuitry configured to tune the frequency-dependent impedance based on a frequency of the input clock, and processing circuitry configured to process a signal based on the output voltage of the PI core and to provide the processed signal to the host.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which.

DETAILED DESCRIPTION

Figure 1:
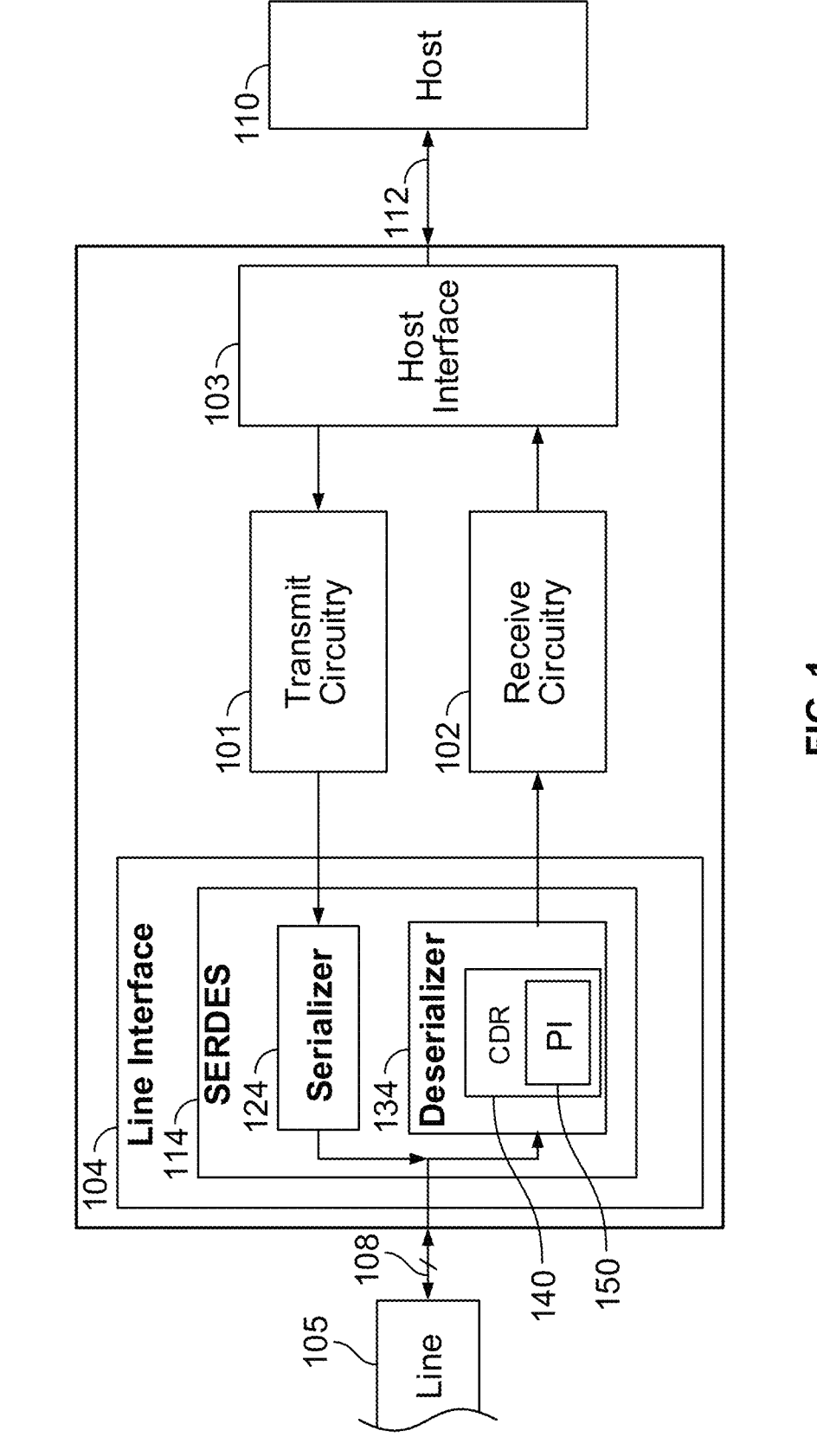
FIG. 1 is a block diagram of a serial data transceiver in accordance with implementations of the subject matter of this disclosure.

Serializer/deserializer (SERDES) circuitry may be included within integrated circuit transceiver devices to convert between parallel and serial data (i.e., to serialize or deserialize the data). A SERDES at a transmitting device may convert multiple parallel data streams into one serialized signal that is sent to a receiving device. A SERDES at a receiving device may convert the as-received and serial data stream to multiple parallel data streams (e.g., to recover the original data). This process of transmitting and receiving multiple parallel data streams as a single serial data stream reduces the number of data lines that are needed between the transmitting device and the receiving device. It also reduces the power required for data transmission and the sensitivity of the data transmission process to interference.

During deserialization, clock-data recovery (CDR) circuitry may be used to reproduce the multiple parallel data streams from the serial signal. The CDR may include phase interpolator (PI) circuitry to control when the serial signal is sampled such that the CDR circuitry can reproduce the multiple data streams therein. Phase offsets may be used when serializing the multiple parallel data streams as a serial signal. The PI may support associating respective samples with respective phases, and the PI may further provide interpolation to correct for any inconsistencies in the phase offsets.

The PI controls (at least in part) when the sampling occurs according to the spacing between respective parallel data streams that are recovered from the serial signal. To do this, the PI may interpolate between the phase offsets that were used in generating the serial signal. Based on the interpolated output of the PI, a sampler (e.g., of CDR circuitry) may sample the serial data stream at times that are consistent with recovering the multiple parallel data streams of the serial signal.

In some implementations, a PI uses current mode logic (CML) to interpolate between phase offsets. However, a CML-based PI may not provide a sufficient combination of output linearity and insensitivity to noise. A CML-based PI may otherwise or additionally not provide sufficient control over timing (e.g., it may have excess jitter). These features may make a CML-based PI poorly suited for high-speed applications. In contrast, a PI with more precise timing control (e.g., reduced jitter), improved linearity, and greater insensitivity to noise can support higher-speed operation of CDR and deserialization circuitry.

In accordance with some implementations of the subject matter of this disclosure, a PI uses an inductor-capacitor (LC) tank and control circuitry to provide high-speed phase interpolation. The high-speed PI provided in implementations of this disclosure may support high-speed operation based on providing low jitter, a sufficient combination of output linearity and insensitivity to noise/interference, or both. Such a high-speed PI may, for example, support SERDES operating at 112 GHz or SERDES operating at higher frequencies.

In accordance with some implementations of the subject matter of this disclosure, the PI uses the LC tank to convert a current output of the PI core (which is defined below) to a voltage output. Control circuitry of the PI tunes an impedance of the LC tank to provide a maximum impedance at a frequency corresponding to that of the serial input signal. When operating at the maximum impedance, the current output is converted into a corresponding maximum voltage output. With the LC tank providing the maximum voltage, an output buffer of the PI can rapidly provide a sample timing signal to the CDR. Thus, high-speed operation of the CDR is supported by the high-speed PI.

The subject matter of this disclosure may be better understood with reference to FIGS. 1-7.

FIG. 1 is a high-level block diagram of a processor or network device having serial data transceiver 100, which may incorporate implementations of the subject matter of this disclosure. Transceiver 100 may include transmit circuitry 101, which is configured to send data to serializer 124, and receive circuitry 102, which is configured to receive data from deserializer 134. As described above, serializer 124 may serialize a data stream (e.g., for subsequent transmission) and deserializer 134 may deserialize a data stream (e.g., for subsequent reproduction of the transmitted data). Deserializer 134 includes CDR circuitry 140, which includes PI circuitry 150 for controlling (at least in part) when sampling by CDR circuitry 140 of a signal received over line interface 104 occurs.

Serial data transceiver 100 is communicatively coupled to line 105 (e.g., which may represent any suitable transmission medium, including a copper or fiber cable, or any suitable wireless channel). Line interface 104 of serial data transceiver 100 may be configured for two-way coupling to line 105, meaning that line interface 104 may send data (e.g., from serializer 124) to line 105 or line interface 104 may receive data (e.g., into deserializer 134) from line 105, as shown by the data flow path 108 connected to line 105, serializer 124, and deserializer 134. Received data may be deserialized at least in part by using implementations of the subject matter of this disclosure.

Serial data transceiver 100 may also include host interface 103 for communication with locally-situated host device 110 over connection 112. Host device 110 may be configured to, over connection 112, receive multiple data streams that are recovered by deserializing a serial data stream, with deserializer 134 (and CDR circuitry 140, and PI circuitry 150) configured to deserialize and recover multiple parallel data streams from one serial stream.

Figure 2:
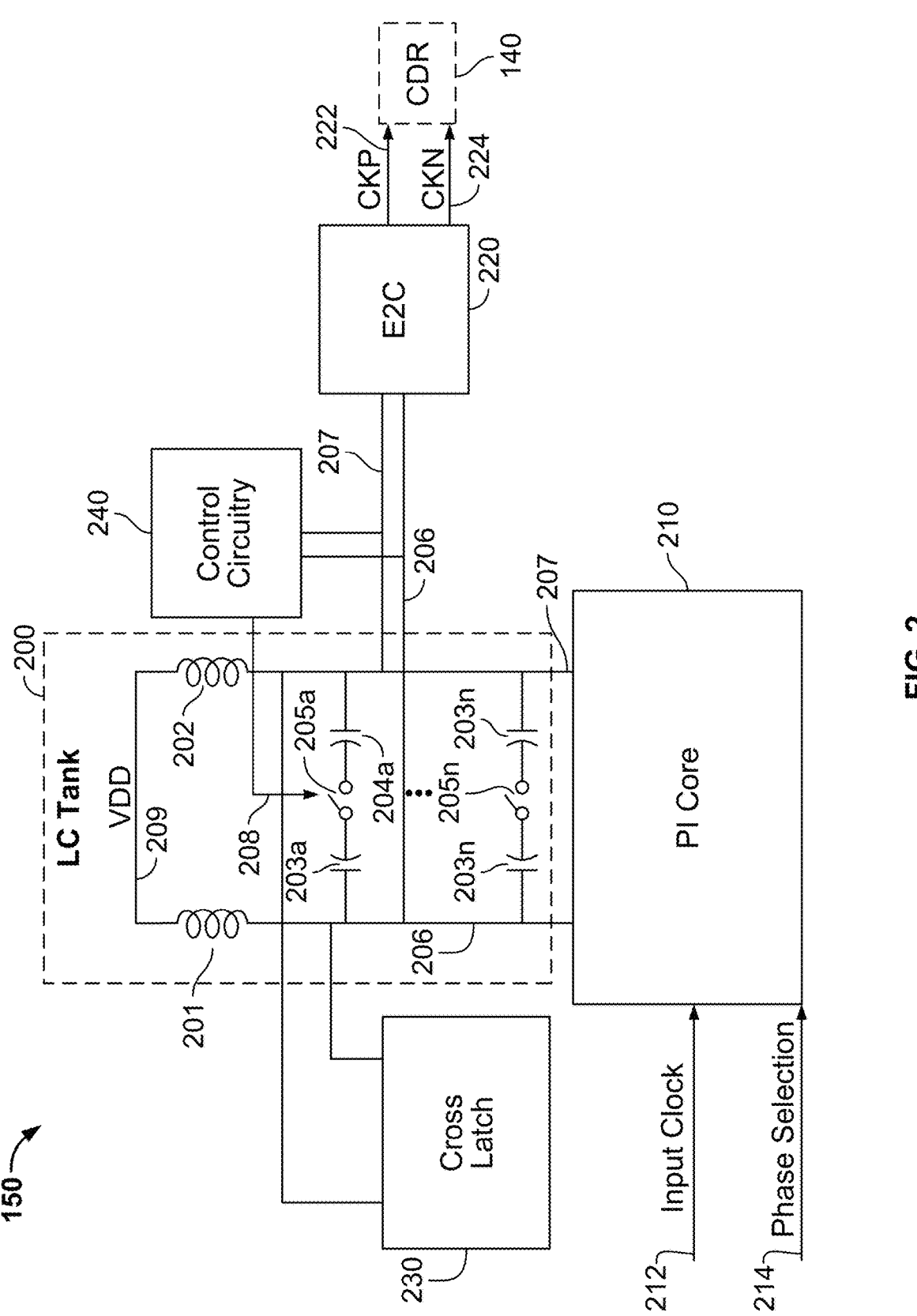
FIG. 2 is a block diagram of a phase interpolator (PI) in accordance with implementations of the subject matter of this disclosure.

FIG. 2 shows a block diagram of PI 150 which may, in accordance with some implementations of this disclosure, be a high-speed PI (e.g., the PI may provide sufficiently low jitter, linearity, and insensitivity to noise to support the deserialization of signals at or above 112 GHZ). At a high level, PI 150 includes LC tank 200, PI core 210, edge-to-clock (E2C) circuitry 220 (e.g., for amplifying signal magnitudes to digital logic levels), cross latch 230, and control circuitry 240. Inputs to the PI 150 include input clock 212 and phase selection 214. The PI 150 generates output 222 (e.g., a first clock or a positive leg of a differential clock, which may be denoted as "CKP") and output 224 (e.g., a second clock or the negative leg of the differential clock, which may be denoted as "CKN". As shown, these outputs are coupled at least to CDR circuitry 140 to control when CDR circuitry 140 samples an incoming serial signal to recover multiple parallel data streams from the serial signal.

Figure 3:
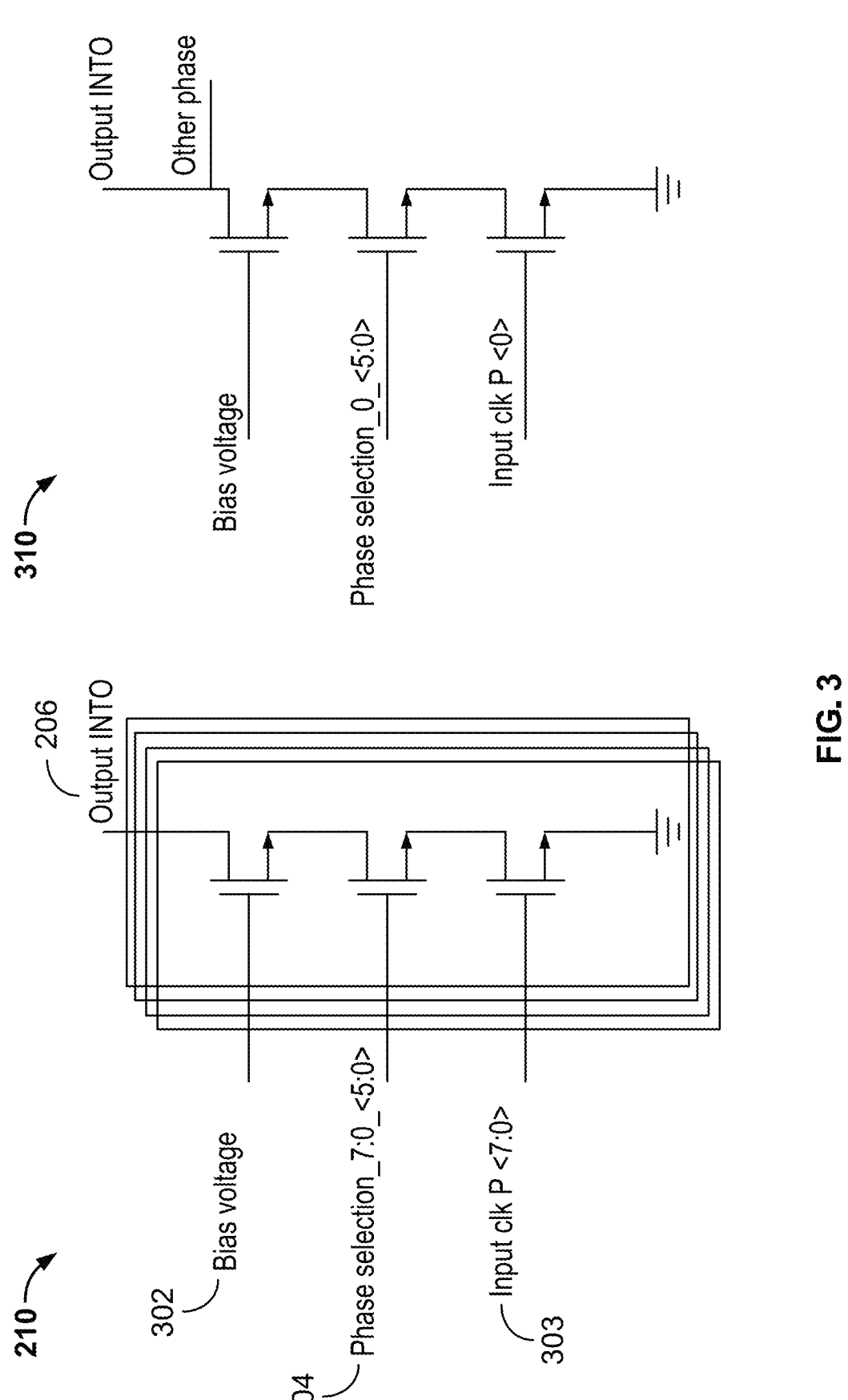
FIG. 3 is a block diagram of a PI core in accordance with implementations of the subject matter of this disclosure.

The PI core 210, which is further described at least in connection with FIG. 3, receives the aforementioned inputs and generates current outputs (e.g., differential current outputs), namely PI core output 206 (e.g., "INTO", which may be the positive leg of a differential PI core 210 output) and PI core output 207 (e.g., "INTOB", which may the negative leg of the differential PI core 210 output). Based on the frequency-dependent impedance of LC tank 200, as further described below, these current outputs are provided as voltages to E2C 220, which may be regarded as an output buffer of PI 150. E2C 220 scales the voltages that it receives to respective digital logic levels (e.g., which may correspond to a supply voltage and a ground voltage, or any other suitable pair of reference voltages). Then, E2C 220 provides these scaled voltages, namely clock signal 222 (e.g., a positive clock signal, or "CKP") and clock signal 224 (e.g., a negative clock signal, or "CKN", which may be the opposite of clock signal 222), as output signals to other circuitry of CDR 140 (e.g., a sampler or a clock of CDR circuitry 140). In FIG. 2, CDR 140 is represented with a dashed line because it is not a component of PI 150; rather, PI 150 is a component of CDR 140, as shown in FIG. 1, and PI 150 may provide its aforementioned output signals to other components of CDR 140, as described above.

LC tank 200 provides a tunable and frequency-dependent impedance. By tuning the impedance of LC tank 200 to be maximized at a frequency of interest (e.g., the frequency of input clock 212), control circuitry 240 causes LC tank 200 to convert output currents of the PI core 210 to maximized output voltages. These maximized output voltages can, for example, be processed at E2C 220 faster than lesser output voltages. As a result, high-speed PI 150 may provide clock signals 222 and 224 in a way that supports high-speed operation of CDR 140 and deserializer 134.

The frequency-dependent impedance of LC tank 200 is provided as follows. The LC tank 200 includes a pair of inductors 201 and 202, each of which is associated with a respective branch of the LC tank 200. Each of these two branches of the LC tank 200 also includes multiple capacitors. The first branch (e.g., as is coupled to PI core output 206) includes capacitors 203a through 203n, and the second branch (e.g., as is coupled to PI core output 207) includes capacitors 204a through 204n. As used in connection with multiple aspects of FIG. 2, 'n' represents any suitable integer. Each respective capacitor of the first branch (e.g., capacitor 203a) is associated with a corresponding respective capacitor of the second branch (e.g., capacitor 204a), and each respective pair of corresponding capacitors is arranged with a respective switch 205 between them. Thus, LC tank 200 also includes switches 205a through 205n.

According to the arrangement of LC tank 200 as shown in FIG. 2 and as described above, any number of zero through 'n' discrete current paths may be provided between respective capacitors 203 and 204 and between the first and second branches of the LC tank 200. The state (i.e., opened or closed) of each switch 205 configures whether or not the corresponding current path contributes to the frequency-dependent impedance of the LC tank 200. Thus, control circuitry 240 can provide LC tank control signal 208 to cause each switch 205 to be in a particular state so as to maximize the impedance of LC tank 200 at the frequency of interest.

In some implementations, as further described at least in connection with method 700 (as shown below in FIG. 7), the LC tank control signal 208 causes LC tank 200 to sweep through multiple configurations of switch 205 states. As used herein, a configuration of switch 205 states refers to any combination of switch 205 states that is imposed to yield a particular frequency-dependent impedance on LC tank 200. By causing LC tank 200 to sweep through multiple configurations of switch 205 states, control circuitry 240 may store one or more voltages associated with a respective one or more configurations to determine which configuration yields the maximum voltage (e.g., where the maximum voltage corresponds to the maximum impedance of the LC tank 200).

In some implementations, cross latch 230 is provided within PI 150 to control a quality factor of LC tank 200. The quality factor of LC tank 200 may refer to a frequency-dependent impedance profile associated with LC tank 200, where a higher quality factor may indicate a sharper frequency peak occurring at the frequency of interest. The cross latch 230 may contribute a negative impedance to the overall impedance of the LC tank 200—e.g., to provide a greater precision over control of the frequency-dependent impedance than that which is provided by only operating the switches 205.

The inductor-capacitor network of LC tank 200 may form a resonance network. This resonance network may be biased by reference voltage 209 (e.g., "VDD" or any other suitable reference voltage) and tuned by LC tank control signal 208. Tuning the resonance network may include setting the resonance frequency of the network to the frequency of the input clock signal 212, or to any other frequency of interest. Setting the resonance frequency may include causing the impedance of the LC tank 200 to peak at the frequency of interest. The quality factor of this resonance network may refer to the full-width at half-maximum (FWHM) of the frequency-dependent impedance profile, or to any other aspect of the sharpness associated with the resonance frequency.

In some implementations, the impedance of the LC tank 200 (e.g., at or near the resonance frequency) results in the LC tank 200 filtering out (i.e., reducing a magnitude of): jitter from timing mismatch (e.g., between PI 150 and input clock 212, or between PI 150 and any other clock or circuitry of CDR 140); input noise (e.g., due to interference associated with line 105); or a combination thereof.

The capacitors 203 and 204 may be regarded as programmable because of how current can be controlled to flow through or bypass each pair of capacitors based on the state of each switch 205. These programmable capacitors are used to tune the frequency-dependent impedance of the LC tank 200.

FIG. 3 shows illustrative details of PI core 210 in accordance with some implementations of this disclosure. As represented by the three tiled boxes enclosing the column of three transistors, PI core 210 may include any suitable number of transistor columns. The number of transistor columns of PI core 210 may correspond to the number of phases associated with an incoming serial signal. For example, FIG. 3 indicates eight columns of transistors (e.g., based on input signals 212 and 214 being associated with 8-bit, or 0:7, indicators), which may correspond to eight parallel data streams that can be recovered from the serial signal.

Each transistor of each column of PI core 210 receives a respective signal at its gate terminal. As shown, the top transistors receive one or more bias voltage 302, the middle transistors receive a phase selection signal 214, and the bottom transistors receive an input clock signal 303 (e.g., which may be a component of input clock 212). The magnitude of bias voltage 302 may adjust a current magnitude associated with PI core outputs 206 and 207. The magnitude of bias voltage 302 may also adjust a linearity of the interpolation provided by the PI core 210. The phase selection signal 304 (e.g., which may be a component of phase selection signal 214) may encode for one of N phases (i.e., as indicated by 7:0 for the illustrative example in which N=8), and it may also encode for an interpolation condition with N bits of precision (i.e., as indicated by <5:0> for the illustrative example in which N=6 and the selection signal represents a value that may correspond to any one of $2^6$ possible degrees of interpolation). The input clock signal 212 may be a first leg (e.g., as indicated by "clk P") of a differential clock, which is associated with a second leg (e.g., "clk N", which may be the opposite of "clk P"). The first and second legs of the differential input clock 212 (e.g., as shown in FIGS. 2 and 3) may trigger the phase-specific generation of differential output clocks CKP 222 and CKN 224 as shown in FIG. 2.

Based at least on input clock signal 303 and phase selection signal 304, any two adjacent columns of PI core 210 may be simultaneously activated to contribute to PI core output 206 (or to PI core output 207, as is generated, in a differential implementation, by the other leg of PI core 210) with particular degrees of interpolation. The particular degrees of interpolation can dictate which phase of the two adjacent phases more strongly influences the output. Accordingly, the neighboring phases of PI core 210 generate output signal 206, or "INTO", which indicates a sampling time (e.g., as is associated with a target phase) based on the input clock signal 303 and the input phase selection signal 304.

With PI core 210 being a differential PI core, each respective column of transistors depicted in FIG. 3 represents a column of the first leg (e.g., that is used to generate a positive leg of the differential signal) and has a corresponding column of transistors of the second leg (e.g., that is used to generate a negative leg of the differential signal). The second-leg columns receive an input clock signal (e.g., "clk n") that may be the opposite of input clock signal 303. The second-leg columns also receive a phase selection signal that may be the opposite of phase selection signal 304. In the differential implementation, based on the target phase selection, PI core 210 drives PI core outputs 206 and 207 to target values. As mentioned, the target values may be indicative of a phase and may more particularly be indicative of a specific timing that is associated with sampling of the phase.

Schematic 310 of FIG. 3 shows illustrative details of a single column of PI core 210. This single column may be a first column (and it may be illustrative of each other column), as indicated by phase selection 0 and input clock <0>. Schematic 310 is indicative of either leg of a differential implementation of PI core 210. Being a first column means that this column provides an interpolation to support the sampling of a first data stream (e.g., of eight or any other number of parallel data streams that are in a serial input signal). As shown by the line extending horizontally from the drain terminal of the top transistor of schematic 310, each downstream column (i.e., columns corresponding to phase selections greater than 0) of the PI core 210 may be coupled to the first column, and to each other downstream column, at the output circuit node. Thus, each column can contribute to a respective output signal 206 when the respective column is selected (e.g., when the corresponding phase is being sampled).

Figure 4:
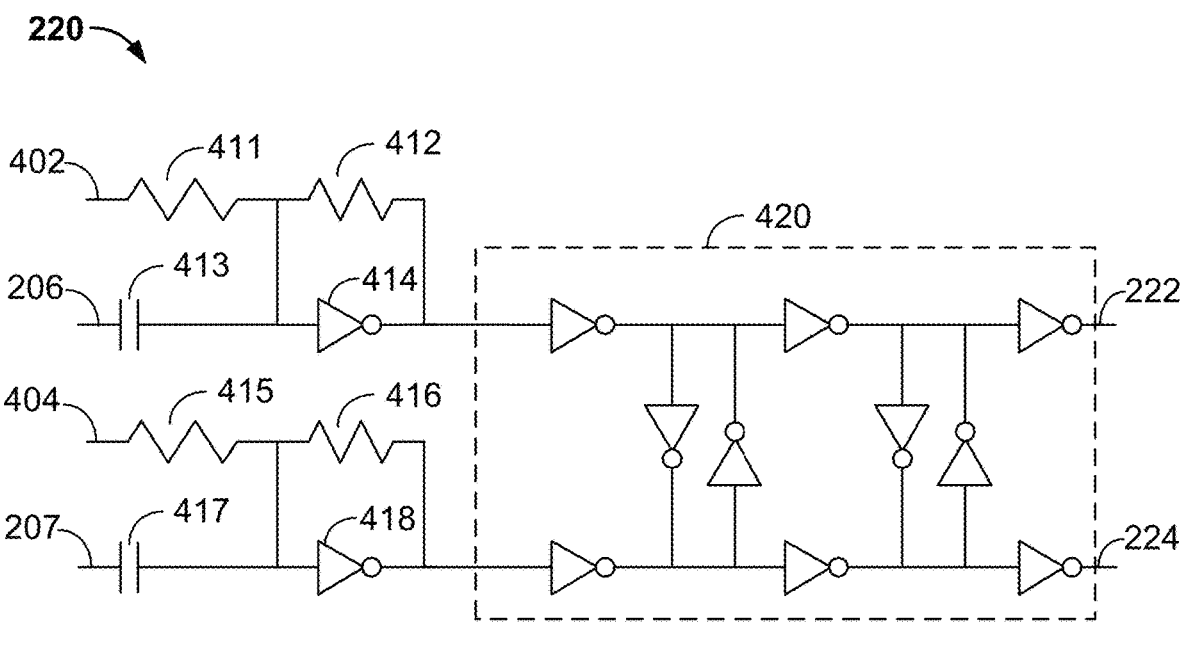
FIG. 4 is a block diagram of an edge-to-clock (E2C) converter in accordance with implementations of the subject matter of this disclosure.

FIG. 4 shows illustrative details of E2C circuitry 220 in accordance with some implementations of this disclosure. E2C circuitry 220 receives PI core output 206 and 207 and provides output signals CKP 222 and CKN 224. As shown and described at least in connection with FIG. 2, these outputs CKP 222 and CKN 224 may be provided as clock signals to CDR 140 (e.g., to control when CDR 140 samples the incoming signal). PI core outputs 206 and 207 may be received at E2C circuitry 220 with voltage magnitudes that are less than a digital logic level, and E2C circuitry 220 may amplify these voltage magnitudes up to the digital logic level (or sufficiently close to the digital logic level). Because of how PI 150, including control circuitry 240, provides PI core outputs 206 and 207 at maximum (or otherwise larger than may be provided by a PI without LC tank 200) voltage magnitudes, E2C circuitry 220 may more rapidly amplify these voltage magnitudes and provide them to CDR 140.

E2C circuitry 220 also receives bias voltage 402 and bias voltage 404. The magnitudes of these bias voltages may be tuned (e.g., by control circuitry 240) to correct for duty cycle offsets that occur in PI core output 206 or 207.

Within E2C circuitry 220, resistors 411 and 415 may be provided to set a particular voltage at the input nodes to delay blocks 414 and 418, respectively. Feedback resistors 412 and 416 may be provided, with corresponding delay blocks 414 and 418, respectively, to perform the voltage magnitude amplification. Input capacitors 413 and 417 may be provided to block a DC signal or otherwise filter at least one signal component associated with PI core output 206 or 207, respectively. The arrangement 420 of two cross-latches, including the configuration of the delay blocks as shown, may provide fully differential clocks at E2C outputs 222 and 224.

Figure 5:
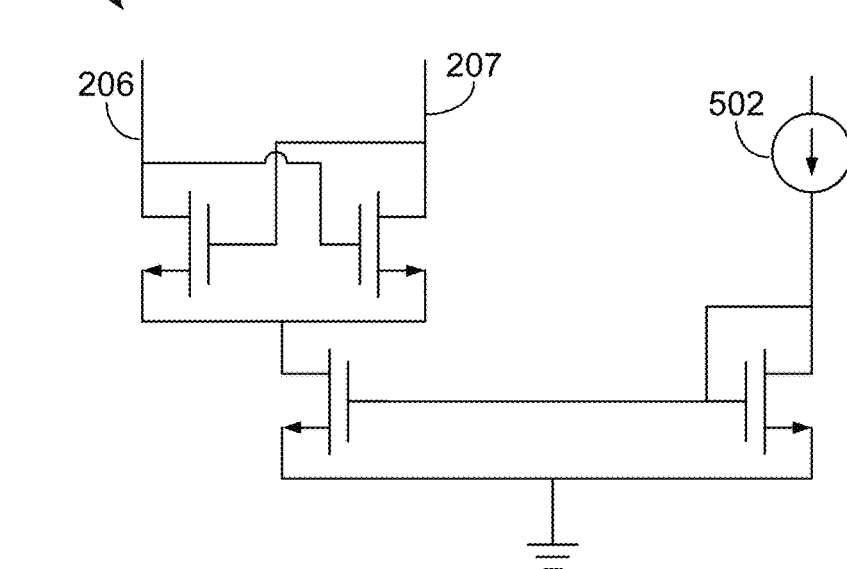
FIG. 5 is a block diagram of a cross latch in accordance with implementations of the subject matter of this disclosure.

FIG. 5 shows illustrative details of cross latch 230 in accordance with some implementations of this disclosure. Cross latch 230 receives PI core outputs 206 and 207 at the respective branches as shown. These respective branches are coupled to drain terminals of respective NMOS transistors. Each of these branches are also cross-coupled to the respective gate terminal of the NMOS transistor of the other branch. As per the arrangement of cross latch 230, the aforementioned NMOS transistors form a current mirror that drives a current equal to that of current source 502 through one or both of the branches coupled to PI core outputs 206 and 207.

Because of how cross latch 230 is coupled to LC tank 200, the current flowing through the cross-coupled NMOS transistors of cross latch 230 contributes a negative impedance to LC tank 200. The magnitude of this negative impedance may be adjusted (e.g., by control circuitry 240) by controlling the amount of current flowing through current source 502.

By providing the negative impedance, cross latch 230 can increase the voltage magnitudes of PI core outputs 206 and 207. This negative impedance can otherwise or additionally control the quality factor of the LC tank 200. The LC tank 200 and the cross latch 230 may together be regarded as an oscillator that is coupled to PI core 210 to provide for high-speed PI 150 operation through at least the mechanisms described in connection with this disclosure.

Figure 6:
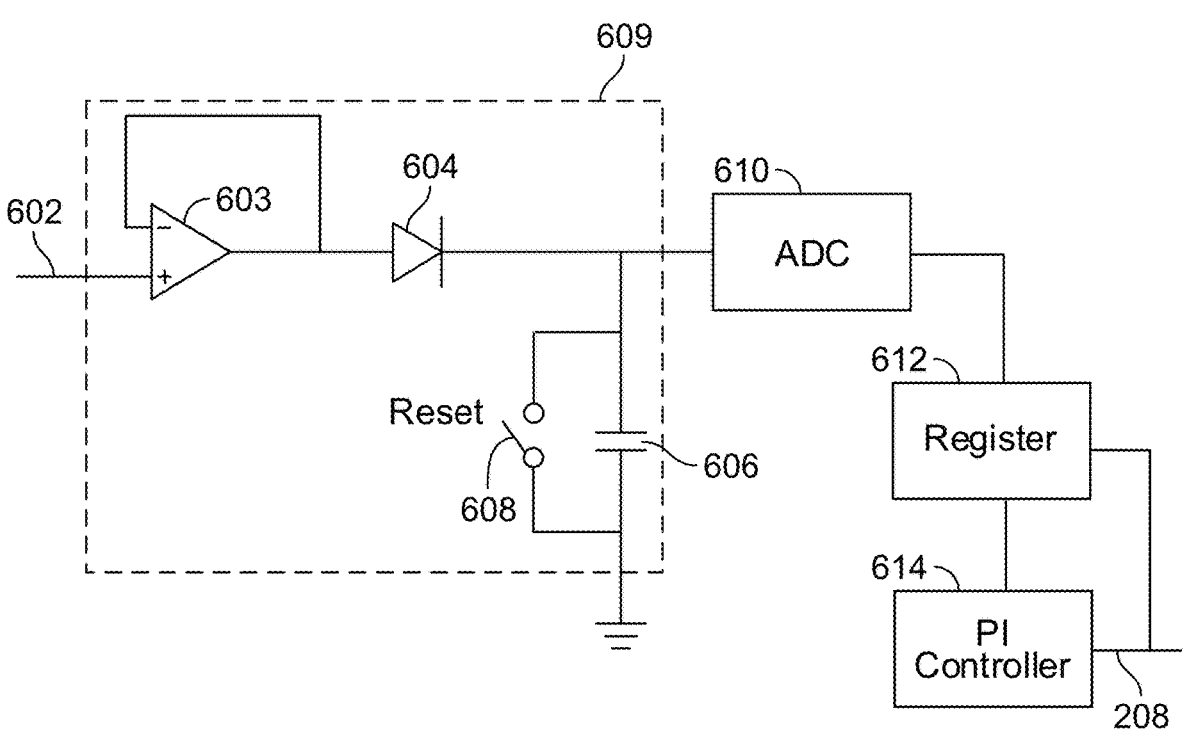
FIG. 6 is a block diagram of control circuitry in accordance with implementations of the subject matter of this disclosure.

FIG. 6 shows illustrative details of control circuitry 240 in accordance with some implementations of this disclosure. Control circuitry 240 controls states of the switches 205 (e.g., to realize any suitable configuration of the programmable capacitors 203 and 204) to provide a maximum impedance (e.g., a resonance impedance) of LC tank 200 at a frequency of interest (e.g., a resonance frequency, which may correspond to the frequency of input clock 212). In some implementations, control circuitry 240 additionally controls (directly or indirectly) any one or more of bias voltages 302, bias voltages 402 and 404, and the current of current source 502. Thus, control circuitry 240 causes PI 150 to provide PI outputs 206 and 207 at maximum voltage levels.

Control circuitry 240 includes operational amplifier 603, diode 604, capacitor 606, and reset switch 608, which may collectively be referred to as peak detection circuit 609. Control circuitry 240 also includes analog-to-digital (ADC) converter 610, register 612, and PI controller 614, which are further described below.

At a high level, control circuitry 240 sweeps through multiple possible configurations of LC tank 200 and inspects the corresponding voltage level of input signal 602, which relates to (or may be equal to) the voltage level of at least one PI core output 206 or 207. Moreover, control circuitry 240 stores at least one voltage level, which corresponds to the maximum amplitude voltages at PI core output 206 and 207, and at least one code indicating the switch 205 states used in the configuration of the LC tank 200 that generates those maximum amplitudes voltages.

Peak detection circuit 609 records a voltage level of input signal 602. Input signal 602 may be, or otherwise correspond to, either of PI core output 206 or 207. Based on the feedback configuration of operational amplifier 603, a voltage level of input signal 602 is provided at the input to diode 604, which acts as a single-direction buffer. Diode 604 only permits current at a voltage level greater than the forward voltage of the diode 604 to conduct thereby and charge capacitor 606. Thus, the charging of capacitor 606 is directly proportional to the voltage of input signal 602. After the capacitor 606 voltage (and, by extension, the input signal 602 voltage) has been inspected (e.g., which may include storing the voltage at register 612, or determining that a present capacitor 606 voltage is less than a capacitor 606 voltage stored at register 612), reset switch 608 may be closed to discharge the capacitor 606. For example, reset switch 608 may be closed when the peak detection circuit 609 transitions from monitoring a voltage associated with a present phase to monitoring that of a subsequent phase. In turn, capacitor 606 may recharge and be used to inspect the voltage of a subsequent input signal 602.

At the output of peak detection circuit 609, ADC 610 converts the voltage across capacitor 606 to a digital code, which is stored in register 612. This digital code may be indicative of both the capacitor 606 voltage and a corresponding configuration of the LC tank 200. For example, the digital code may include a first binary string representing a voltage of capacitor 606 and a second binary string representing the state of each switch 205 in the corresponding configuration of the LC tank 200.

In some implementations, register 612 may store a single digital code, which includes a maximum voltage; for each respective configuration of LC tank 200, register 612 may be configured to (i) compare the stored maximum voltage to the voltage provided by ADC 610 and (ii) store the ADC 610 voltage only if that voltage is greater than the stored (and previous maximum) voltage, which is then discarded. In other implementations, register 612 may store multiple voltages (e.g., each corresponding to a particular configuration of LC tank 200), and after each configuration has been tried and the resulting voltage stored in register 612, register 612 may be inspected (e.g., by PI controller 614) to determine which one of the multiple voltages is the greatest.

PI controller 614 is configured to read a digital code from register 612 and provide LC tank control signal 208. As mentioned, LC tank control signal 208 indicates a particular configuration of switches 205 of LC tank 200. In some implementations, LC tank control signal 208 may also provide (directly or indirectly) information related to any other aspect of PI 150 that is controlled by control circuitry 240. LC tank control signal 208 is fed back to register 612 such that register 612 can associate (and store, or use in a comparison) a voltage level provided by ADC 610 with a corresponding configuration of LC tank 200.

Figure 7:
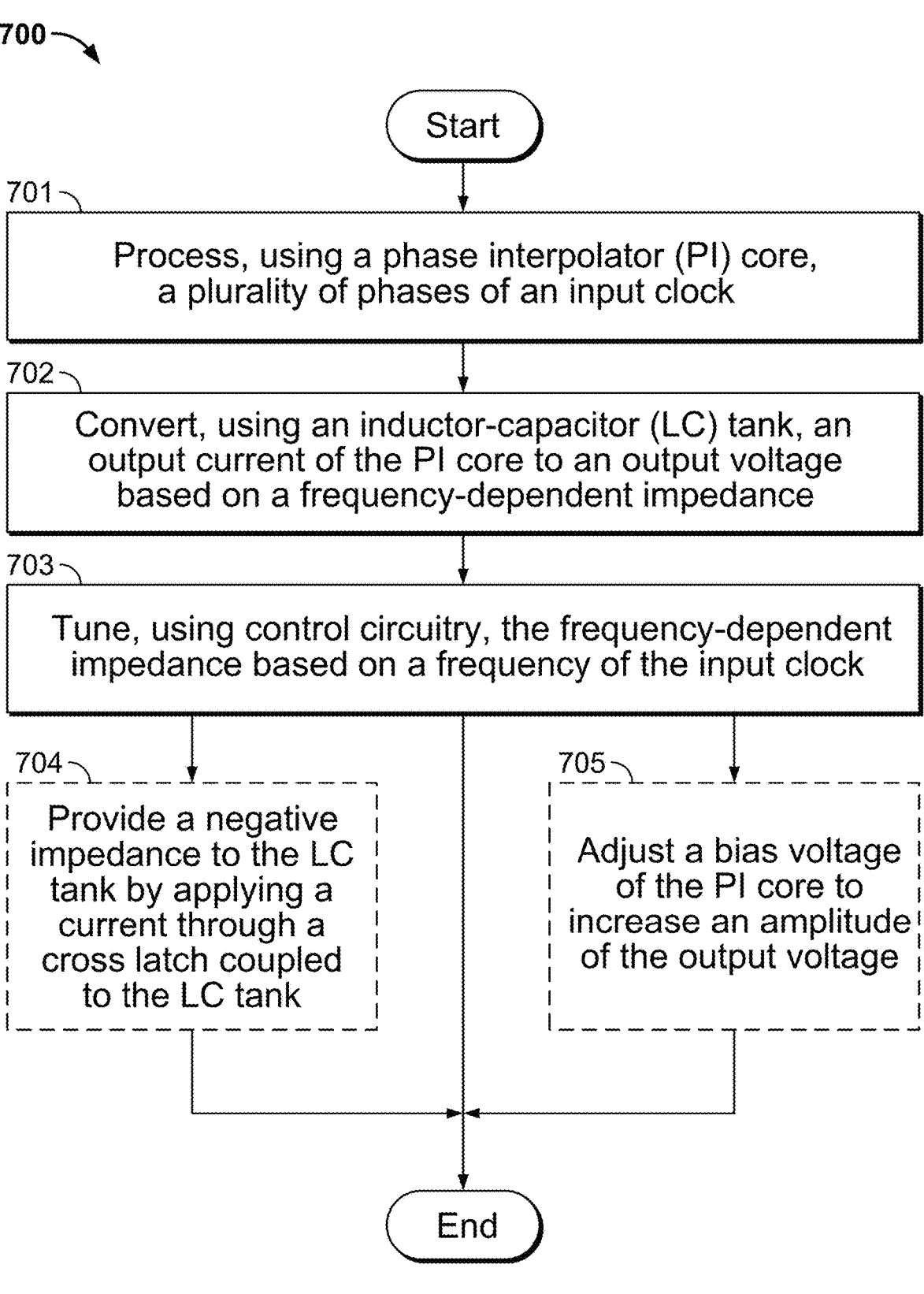
FIG. 7 is a flow diagram of a method for operating a high-speed PI in accordance with implementations of the subject matter of this disclosure.

FIG. 7 is a flow diagram of a method 700 that may be used in connection with operating a high-speed phase interpolator (e.g., PI 150) according to some implementations of the subject matter of this disclosure. In some implementations, method 700 is performed by transceiver 100, in particular by PI 150 (as may be included within CDR 140, which may be included within deserializer 134).

At 701, a plurality of phases of an input clock (e.g., input clock 212) are processed using a phase interpolator core (e.g., PI core 210). Each one of the plurality of phases may correspond to one of multiple parallel data streams that can be recovered from a serial input signal. The PI core 210 may correct for offsets associated with timing that is used for controlling when these data streams are sampled.

At 702, an output current of the PI core 210 is converted, using an LC tank (e.g., LC tank 200) to an output voltage based on a frequency-dependent impedance. The output voltage and the output current may be associated with each of PI core output 206 and 207. The frequency-dependent impedance may be provided by LC tank 200.

At 703, the frequency-dependent impedance is tuned (e.g., by control circuitry 240) based on a frequency of the input clock. The frequency-dependent impedance may be tuned so as to maximize the impedance at the frequency of the input clock. Tuning the frequency-dependent impedance may include opening or closing one or more switch 205 of LC tank 200.

In some implementations, an approach for tuning the frequency-dependent impedance is provided as follows. Control circuitry 240 may sweep through every possible configuration (or a sufficient subset of configurations) of LC tank 200. This sweep may be associated with a corresponding number of digital codes, where each digital code encodes the state of each respective switch 205 for the given configuration. At each possible configuration, peak detector circuitry 609 charges capacitor 606 and thereby determines a magnitude of an output voltage provided by PI core 210 and LC tank 200. Determining the magnitude may include inspecting and comparing the present output voltage to a stored output voltage, or it may include inspecting multiple stored output voltages and determining a maximum output voltage from among the multiple stored output voltages. In response to determining the maximum output voltage, based on the corresponding configuration of LC tank 200, control circuitry 240 provides LC tank control signal 208 to implement that configuration and to cause the LC tank 200 to provide the PI core outputs 206 and 207 with maximum output voltages.

In some implementations, method 700 includes the optional action at 704 of providing a negative impedance to the LC tank. Despite being shown as occurring after 703, providing the negative impedance at 704 may occur before or after the tuning at 703. Providing the negative impedance may include adjusting a current (e.g., by modifying a current provided by current source 502) flowing through cross latch 230. Providing the negative impedance may increase a voltage associated with PI core outputs 206 and 207. Providing the negative impedance may otherwise or additionally increase a quality factor associated with the impedance of LC tank 200 at the resonance frequency.

In some implementations, method 700 includes the optional action at 705 of adjusting a bias voltage adjusting a bias voltage (e.g., any one or more of bias voltages 302, 402, or 404). The control circuitry 240 may directly adjust these bias voltages, or it may indirectly adjust these bias voltages by sending a signal to other circuitry (e.g., PI core 210 or E2C circuitry 220) that causes these bias voltages to be adjusted.

While NMOS transistors are shown in various parts of this disclosure, any suitable transistor may be used in connection with the circuitry provided in this disclosure.

Any multi-part reference numerals (e.g., as used in connection with switch 205*a* through switch 205*n*) may be collectively referenced by the shared reference numeral (e.g., switch 205). Such multi-part reference numerals may be used to indicate that multiple discrete elements have a common characteristic.

As used herein, and in the claims which follow, the term "maximum voltage" refers to a maximum one of all of the values that are achieved within the context of presenting a resistance or impedance at the output of a circuit block (e.g., at the output of PI core 210). This maximum voltage should not be construed as a supply voltage or another maximum voltage of a broader integrated circuit system (e.g., of transceiver 100).

Thus it is seen that an apparatus including high-speed phase interpolator circuitry, and a method for operating the high-speed phase interpolator circuitry, has been provided.

As used herein and in the claims which follow, the construction "one of A and B" shall mean "A or B."

It is noted that the foregoing is only illustrative of the principles of the invention, and that the invention can be practiced by other than the described implementations, which are presented for purposes of illustration and not of limitation, and the present invention is limited only by the claims which follow.

What is claimed is:

1. A transceiver for a network device including clock-data recovery (CDR) circuitry that operates based on an input clock associated with a transmitted signal received by the transceiver, the CDR circuitry comprising:
   a phase interpolator (PI) core configured to process a plurality of phases of the input clock;
   an inductor-capacitor (LC) tank configured to convert an output current of the PI core to an output voltage based on a frequency-dependent impedance; and
   control circuitry configured to detect the output voltage, and, based on the output voltage, tune the frequency-dependent impedance to maximize the output voltage for a frequency of the input clock.

2. The transceiver of claim 1, wherein the control circuitry is configured to i) based on the output voltage, determine whether the frequency-dependent impedance is tuned to maximize the output voltage for the frequency of the input clock, and ii) tune the frequency-dependent impedance in response to the frequency-dependent impedance not being tuned to maximize the output voltage.

3. A transceiver for a network device including clock-data recovery (CDR) circuitry that operates based on an input clock associated with a transmitted signal received by the transceiver, the CDR circuitry comprising:
   a phase interpolator (PI) core configured to process a plurality of phases of the input clock;
   an inductor-capacitor (LC) tank configured to convert an output current of the PI core to an output voltage based on a frequency-dependent impedance, wherein the LC tank comprises
   a first branch and a second branch, each of the first branch and the second branch comprising an inductor and a plurality of capacitors, and
   a plurality of switches, wherein each respective switch of the plurality of switches is arranged between a respective capacitor of the first branch and a respective capacitor of the second branch; and
   control circuitry configured to tune the frequency-dependent impedance based on a frequency of the input clock.

4. The transceiver of claim 3, wherein the control circuitry is configured to tune the frequency-dependent impedance by opening or closing switches of the plurality of switches.

5. The transceiver of claim 4, wherein the control circuitry comprises peak detector circuitry configured to determine a magnitude of the output voltage.

6. The transceiver of claim 5, wherein the peak detector circuitry comprises:

an operational amplifier configured to charge a capacitor based on the output current and the frequency-dependent impedance; and a register configured to store at least one voltage of the capacitor, wherein determining the magnitude of the output voltage is based on the at least one voltage of the capacitor.

7. The transceiver of claim 6, wherein the control circuitry is further configured to:

implement a plurality of configurations of the plurality of switches, each respective one of the plurality of configurations corresponding to a respective frequency-dependent impedance; and determine a maximum voltage of the capacitor based on inspecting the at least one voltage of the capacitor for each configuration of the plurality of configurations.

8. The transceiver of claim 7, wherein the control circuitry is further configured to implement a particular configuration of the plurality of configurations to cause the LC tank to provide the magnitude of the output voltage as a maximum output voltage.

9. The transceiver of claim 3, wherein:

the PI core is configured to receive a differential input and provide a differential output; and the first branch and the second branch of the LC tank are coupled to respective differential legs of the PI core.

10. A transceiver for a network device including clock-data recovery (CDR) circuitry that operates based on an input clock associated with a transmitted signal received by the transceiver, the CDR circuitry comprising:

a phase interpolator (PI) core configured to process a plurality of phases of the input clock;

an inductor-capacitor (LC) tank configured to convert an output current of the PI core to an output voltage based on a frequency-dependent impedance;

a cross latch coupled to the LC tank to tune a quality factor of the frequency-dependent impedance; and control circuitry configured to tune the frequency-dependent impedance based on a frequency of the input clock.

11. The transceiver of claim 10, wherein:

the cross latch comprises a current mirror; and the control circuitry is further configured to tune the quality factor of the frequency-dependent impedance by controlling a current flowing through the current mirror.

12. A method for operating a transceiver for a network device, the method comprising:

processing, using a phase interpolator (PI) core, a plurality of phases of an input clock;

converting, using an inductor-capacitor (LC) tank, an output current of the PI core to an output voltage based on a frequency-dependent impedance;

detect the output voltage; and based on the output voltage, tuning, using control circuitry, the frequency-dependent impedance to maximize the output voltage for a frequency of the input clock.

13. The method of claim 12, where the LC tank includes a first branch and a second branch, each of the first branch and the second branch comprising an inductor and a plurality of capacitors, and where the LC tank further includes a plurality of switches, each respective switch of the plurality of switches being arranged between a respective capacitor of the first branch and a respective capacitor of the second branch, the method further comprising:

tuning, using the control circuitry, the frequency-dependent impedance by opening or closing switches of the plurality of switches.

14. The method of claim 13, where the control circuitry includes peak detector circuitry, the method further comprising:

determining, using the peak detector circuitry, a magnitude of the output voltage.

15. The method of claim 14, where the peak detector circuitry includes a register and an operational amplifier configured to charge a capacitor based on the output current and the frequency-dependent impedance, the method further comprising:

storing, using the register, at least one voltage of the capacitor; and determining the magnitude of the output voltage based on the at least one voltage of the capacitor.

16. The method of claim 15, further comprising:

implementing, using the control circuitry, a plurality of configurations of the plurality of switches, each respective one of the plurality of configurations corresponding to a respective frequency-dependent impedance; and determining a maximum voltage of the capacitor based on inspecting, using the control circuitry, the at least one voltage of the capacitor for each configuration of the plurality of configurations.

17. The method of claim 16, further comprising implementing, using the control circuitry, a particular configuration of the plurality of configurations to cause the LC tank to provide the magnitude of the output voltage as a maximum output voltage.

18. The method of claim 13, where the first branch and the second branch of the LC tank are coupled to respective differential legs of the PI core; wherein:

processing the plurality of phases of the input clock comprises receiving differential inputs from the input clock and providing differential outputs to the first branch and the second branch of the LC tank, respectively.

19. The method of claim 12, further comprising tuning, using a cross latch coupled to the LC tank, a quality factor of the frequency-dependent impedance.

20. The method of claim 19, where the cross latch includes a current mirror; wherein:

tuning, using the control circuitry, the frequency-dependent impedance comprises controlling a current flowing through the current mirror.

21. A network device including a transceiver and a host, the transceiver comprising:

a phase interpolator (PI) core configured to process a plurality of phases of an input clock;

an inductor-capacitor (LC) tank configured to convert an output current of the PI core to an output voltage based on a frequency-dependent impedance;

control circuitry configured to tune the frequency-dependent impedance based on a frequency of the input clock; and processing circuitry configured to process a signal based on the output voltage of the PI core and to provide the processed signal to the host.

* * * * *